US009177570B2

(12) United States Patent
Fex et al.

(10) Patent No.: US 9,177,570 B2
(45) Date of Patent: Nov. 3, 2015

(54) TIME SCALING OF AUDIO FRAMES TO ADAPT AUDIO PROCESSING TO COMMUNICATIONS NETWORK TIMING

(75) Inventors: Jan Fex, Lund (SE); Béla Rathonyi, Lomma (SE); Jonas Lundbäck, Vellinge (SE)

(73) Assignee: ST-Ericsson SA, Plan-les-Ouates (CH)

( * ) Notice: Subject to any disclaimer, the term of this patent is extended or adjusted under 35 U.S.C. 154(b) by 511 days.

(21) Appl. No.: 13/087,769

(22) Filed: Apr. 15, 2011

(65) Prior Publication Data

US 2012/0265522 A1 Oct. 18, 2012

(51) Int. Cl.

| | |
|---|---|
| ***G10L 21/00*** | (2013.01) |
| ***G10L 21/04*** | (2013.01) |
| ***G10L 19/16*** | (2013.01) |
| *G10L 25/93* | (2013.01) |
| *G10L 13/00* | (2006.01) |
| *H04J 3/06* | (2006.01) |
| *H04L 12/66* | (2006.01) |
| *G06F 17/00* | (2006.01) |

(Continued)

(52) U.S. Cl.
CPC ............... *G10L 21/04* (2013.01); *G10L 19/167* (2013.01)

(58) Field of Classification Search
USPC ......... 704/201, 270, 503, 214, 228, 262, 211, 704/200.1; 370/516, 350, 503, 352; 700/94; 455/41.2; 381/316; 714/776
See application file for complete search history.

(56) References Cited

U.S. PATENT DOCUMENTS

| | | | | |
|---|---|---|---|---|
| 4,006,314 | A | 2/1977 | Condon et al. | |
| 6,377,931 | B1 * | 4/2002 | Shlomot | G10L 21/04 369/44.32 |
| 6,484,137 | B1 * | 11/2002 | Taniguchi et al. | 704/211 |

(Continued)

FOREIGN PATENT DOCUMENTS

| | | | |
|---|---|---|---|
| EP | 0637179 | A1 | 2/1995 |
| EP | 1353462 | A2 | 10/2003 |
| WO | 01/41337 | A1 | 6/2001 |

OTHER PUBLICATIONS

Grofit, S. et al. "Time-Scale Modification of Audio Signals Using Enhanced WSOLA with Management of Transients." IEEE Transactions on Audio, Speech, and Language Processing, vol. 16, No. 1, Jan. 2008.

(Continued)

*Primary Examiner* — Pierre-Louis Desir
*Assistant Examiner* — Neeraj Sharma
(74) *Attorney, Agent, or Firm* — Coats & Bennett, PLLC

(57) ABSTRACT

Methods and apparatus for coordinating audio data processing and network communication processing in a communication device by using time scaling for either inbound or outbound audio data processing, or both, in an communication device. In particular, time scaling of audio data is used to adapt timing for audio data processing to timing for modem processing, by dynamically adjusting a collection of audio samples to fit the container size required by the modem. Speech quality can be preserved while recovering and/or maintaining correct synchronizing between audio processing and communication processing circuits. In an example method, it is determined that a completion time for processing a first audio data frame falls outside a pre-determined timing window. Responsive to this determination, a subsequent audio data frame is time-scaled to control the completion time for processing the subsequent audio data frame.

27 Claims, 8 Drawing Sheets

(51) Int. Cl.
*H04B 7/00* (2006.01)
*H03M 13/00* (2006.01)

(56) References Cited

U.S. PATENT DOCUMENTS

| | | | | |
|---|---|---|---|---|
| 6,785,261 | B1 | 8/2004 | Schuster et al. | |
| 6,985,856 | B2 | 1/2006 | Wang et al. | |
| 7,027,989 | B1 | 4/2006 | Tapadar et al. | |
| 7,246,057 | B1 | 7/2007 | Sundqvist et al. | |
| 7,650,285 | B2 | 1/2010 | Magliaro et al. | |
| 7,742,916 | B2 | 6/2010 | Barriac et al. | |
| 7,830,862 | B2 | 11/2010 | James | |
| 7,908,147 | B2 | 3/2011 | Ivashin et al. | |
| 8,112,285 | B2 | 2/2012 | Magliaro et al. | |
| 8,185,388 | B2 * | 5/2012 | Gao | 704/228 |
| 2002/0075857 | A1 * | 6/2002 | LeBlanc | 370/352 |
| 2003/0033140 | A1 * | 2/2003 | Taori et al. | 704/214 |
| 2004/0122662 | A1 * | 6/2004 | Crockett | 704/200.1 |
| 2004/0204945 | A1 | 10/2004 | Okuda et al. | |
| 2006/0009983 | A1 | 1/2006 | Magliaro et al. | |
| 2006/0045139 | A1 * | 3/2006 | Black et al. | 370/516 |
| 2006/0074681 | A1 * | 4/2006 | Janiszewski et al. | 704/270 |
| 2006/0153163 | A1 * | 7/2006 | James | 370/352 |
| 2006/0271373 | A1 | 11/2006 | Khalil et al. | |
| 2006/0277051 | A1 | 12/2006 | Barriac et al. | |
| 2006/0285557 | A1 * | 12/2006 | Anderton | H04J 3/0632 370/503 |
| 2008/0240074 | A1 * | 10/2008 | Le-Faucheur et al. | 370/350 |
| 2008/0267224 | A1 * | 10/2008 | Kapoor | G10L 19/167 370/516 |
| 2008/0285599 | A1 * | 11/2008 | Johansson | H04J 3/0632 370/516 |
| 2009/0046698 | A1 | 2/2009 | Chu et al. | |
| 2009/0135976 | A1 | 5/2009 | Ramakrishnan et al. | |
| 2010/0027729 | A1 | 2/2010 | Murphy et al. | |
| 2010/0082338 | A1 * | 4/2010 | Togawa | G10L 21/02 704/221 |
| 2010/0106269 | A1 * | 4/2010 | Garudadri et al. | 700/94 |
| 2011/0077945 | A1 * | 3/2011 | Ojala et al. | 704/262 |
| 2011/0099021 | A1 * | 4/2011 | Zong | G10L 21/04 704/503 |
| 2011/0119565 | A1 * | 5/2011 | Chang | H03M 13/1515 714/776 |
| 2011/0208329 | A1 * | 8/2011 | Castor-Perry | 700/94 |
| 2011/0208517 | A1 * | 8/2011 | Zopf | G10L 21/04 704/211 |
| 2011/0249843 | A1 * | 10/2011 | Holmberg et al. | 381/316 |
| 2011/0257964 | A1 * | 10/2011 | Rathonyi | H04J 3/0697 704/201 |
| 2012/0158409 | A1 * | 6/2012 | Nagel | G10L 19/0208 704/500 |
| 2012/0202425 | A1 * | 8/2012 | Glezerman et al. | 455/41.2 |

OTHER PUBLICATIONS

Verhelst, W. et al. "An Overlap-Add Technique Based on Waveform Similarity (WSOLA) for High Quality Time-Scale Modification of Speech." IEEE Internationals Conference on Acoustics, Speech, and Signal Processing, 1993 (ICASSP-93), vol. 2, Minneapolis, MN, USA, Apr. 27-30, 1993.

3rd Generation Partnership Project. "[draft] Reply LS on CS Voice over HSPA." 3GPP TSG-RAN2 Meeting #60bis, Tdoc R2-080564, Sevilla, Spain, Jan. 14-18, 2008, pp. 1-2.

* cited by examiner

TIME SCALING OF AUDIO FRAMES TO ADAPT AUDIO PROCESSING TO COMMUNICATIONS NETWORK TIMING

RELATED APPLICATIONS

This application is related to co-pending U.S. patent application Ser. No. 12/858,670, filed 18 Aug. 2010 and titled "Minimizing Speech Delay in Communication Devices," and to co-pending U.S. patent application Ser. No. 12/860,410, filed 20 Aug. 2010 and also titled "Minimizing Speech Delay in Communication Devices," The entire contents of each of these related applications are incorporated herein by reference.

TECHNICAL FIELD

The present invention relates generally to communication devices and relates in particular to methods and apparatus for coordinating audio data processing and network communication processing in such devices.

BACKGROUND

When a speech call is performed over a cellular network, the speech data that is transferred is typically coded into audio frames according to a voice coding algorithm such as one of the coding modes of the Adaptive Multi-Rate (AMR) codec or the Wideband AMR (AMR-WB) codec, the GSM Enhanced Full Rate (EFR) algorithm, or the like. As a result, each of the resulting communication frames transmitted over the wireless link can be seen as a data packet containing a highly compressed representation of the audio for a given time interval.

FIG. 1 provides a simplified schematic diagram of those functional elements of a conventional cellular phone 100 that are generally involved in a speech call, including microphone 50, speaker 60, modem circuits 110, and audio circuits 150. Here, the audio that is captured by microphone 50 is digitized in analog-to-digital (A/D) converter 220 and supplied to audio pre-processing circuits 180 via a digital input interface 200. As will be explained in greater detail below, digital input interface 200 may include a buffer to temporarily hold audio data prior to processing by audio pre-processing circuit 180 and audio encoding circuit 160.

Digitized audio is pre-processed in audio pre-processing circuits 180 (which may include, for example, audio processing functions such as filtering, digital sampling, echo cancellation, noise reduction, or the like) and then encoded into a series of audio frames by audio encoder 160, which may implement for example, a standards-based encoding algorithm such as one of the AMR coding modes. The encoded audio frames are then passed to the transmitter (TX) baseband processing circuit 130, which typically performs various standards-based processing tasks (e.g., ciphering, channel coding, multiplexing, modulation, and the like) before transmitting the encoded audio data to a cellular base station via radio frequency (RF) front-end circuits 120.

For audio received from the cellular base station, modem circuits 110 receive the radio signal from the base station via the RF front-end circuits 120, and demodulate and decode the received signals with receiver (RX) baseband processing circuits 140. The resulting encoded audio frames produced by the modem circuits 110 are then processed by audio decoder 170 and audio post-processing circuits 190, and fed through digital output interface 210 to digital-to-analog (D/A) converter 230. The resulting analog audio signal is then passed to the loudspeaker 60.

Digital audio data is generally processed by audio encoding circuit 160 and audio decoding circuit 170 in audio frames, which typically correspond to a fixed time interval, such as 20 milliseconds. (Audio frames are transmitted and received every 20 milliseconds, on average, for all voice call scenarios defined in current versions of the WCDMA and GSM specifications). This means that audio circuits 150 produce one encoded audio frame (for transmission to the network) and consume another (received from the network) every 20 milliseconds, on average, assuming a bi-directional audio link. Typically, these encoded audio frames are transmitted to and received from the communication network at exactly the same rate, although not always. In some cases, for example, two encoded audio frames might be combined to form a single communication frame for transmission over the radio link. In addition, the timing references used to drive the modem circuitry and the audio circuitry may differ, in some situations, in which case a synchronization technique may be needed keep the average rates the same, thus avoiding overflow or underflow of buffers. Several such synchronization techniques are disclosed in U.S. Patent Application Publications 2009/0135976 A1 and 2006/0285557 A1, by Ramakrishnan et al. and Anderton at al., respectively. Furthermore, the exact timing relationship between transmission and reception of the communication frames generally not fixed, at least at the cellular phone end of the link.

Audio pre-processing circuit 180 and audio post-processing circuit 190 can be configured to operate on entire audio frames (e.g., 20-millisecond PCM audio frames), in some systems. In others, all or part of these circuits may be configured to operate on sub-divisions of an audio frame. Given a 20-millisecond audio frame, portions of the audio pre-processing and post-processing circuits may operate on 1, 2, 4, 5, 10, or 20 millisecond audio data blocks. If, for example, pre-processing circuit 180 operates on 10-millisecond blocks, it will execute twice for each speech encoding operation on a 20-millisecond audio data frame.

Digital input interface 200 and digital output interface 210 transfer digital audio (e.g., PCM audio data) over a bus between the audio processing performed in the digital domain (i.e., by preprocessing circuit 180, post-processing circuit 190, encoder 160, and decoder 170) and audio processing performed in the analog domain. (For the purposes of this discussion, A/D and D/A conversion are considered to be analog domain processes.) In many cases, the digital domain processing and analog domain processing are performed using separate integrated circuits. Examples of suitable buses are the well-known I2S bus (developed by Philips Semiconductors) and the SLIMbus (developed by the MIPI Alliance). Transfer across this bus is often implemented using Direct Memory Access (DMA), with transfers of blocks that are multiples of the audio frame size or multiples of the smallest data blocks used by the audio processing circuits.

The audio and radio processing pictured in FIG. 1 contribute delays in both directions of audio data transmission—i.e., from the microphone to the remote base station as well as from the remote base station to the speaker. Reducing these delays is an important objective of communications network and device designers.

SUMMARY

Methods and apparatus for coordinating audio data processing and network communication processing in a communication device are disclosed. Using the disclosed techniques, end-to-end delays and audio glitches can be reduced. End-to-end delays may cause participants in a call to seemingly interrupt each other. A delay can be perceived at one end as an actual pause at the other end, and a person at the first end might therefore begin talking, only to be interrupted by the input from the other end having been underway for, say, 100 ms. Audio glitches could result, for instance, if an audio frame is delayed so much that it must be skipped.

In various embodiments of the invention, time scaling is used for either inbound or outbound audio data processing, or both, in a communication device. In particular, time scaling of audio data is used to adapt timing for audio data processing to timing for modem processing, by dynamically adjusting a collection of audio samples to fit the container size required by the modem. As described in further detail below, this can be done while preserving speech quality and recovering and/or maintaining correct synchronizing between audio processing and communication processing circuits.

Several methods are disclosed for coordinating processing timing in a communications device having an audio processing circuit configured to process audio data frames and a communications processing circuit configured to process corresponding communications frames. In an example method, it is determined that a completion time for processing a first audio data frame falls outside a pre-determined timing window. Responsive to this determination, a subsequent audio data frame is time-scaled to control the completion time for processing the subsequent audio data frame.

In some embodiments, the first audio data frame and the subsequent audio data frame are each outbound audio data frames to be transmitted by the communications device in respective communications frames (such as in the uplink for a mobile phone). In this case, the completion time for audio processing is evaluated relative to a start time for processing the respective communications frame by the communications processing circuit to determine whether the completion time falls outside the pre-determined window. In some of these embodiments, if the completion time for processing the first audio data frame is earlier than the pre-determined timing window then the subsequent audio data frame is time-scaled by compressing the subsequent audio data frame according to a compression ratio. Likewise, in several embodiments, if the completion time for processing the first audio data frame is later than the pre-determined timing window then the subsequent audio data frame is time-scaled by expanding the subsequent audio data frame according to an expansion ratio. In other embodiments, if the completion time for processing the first audio data frame is later than the pre-determined timing window, a series of subsequent audio data frames are compressed, according to a compression ratio, so that the correspondence between audio data frames and communication frames is shifted by at least one communication frame.

Several of the time-scaling techniques disclosed herein may also be applied to inbound audio data processing, such as for the downlink in a mobile phone. Accordingly, where the first audio data frame and the subsequent audio data frame are inbound audio data frames received by the communications device, determining that the completion time for processing the first audio data frame falls outside the pre-determined timing window may be performed by evaluating said completion time relative to a start time for audio playout of the first audio data frame. In several of these embodiments, if the completion time for processing the first audio data frame is earlier than the pre-determined timing window then the subsequent audio data frame is time-scaled by compressing the subsequent audio data frame according to a compression ratio. Likewise, in some embodiments, if the completion time for processing the first audio data frame is later than the pre-determined timing window then the subsequent audio data frame is time-scaled by expanding the subsequent audio data frame according to an expansion ratio.

Audio processing circuits and communication devices containing one or more processing circuits configured to carry out the above-summarized techniques and variants thereof are also disclosed. Of course, those skilled in the art will appreciate that the present invention is not limited to the above features, advantages, contexts or examples, and will recognize additional features and advantages upon reading the following detailed description and upon viewing the accompanying drawings.

DETAILED DESCRIPTION

In the discussion that follows, several embodiments of the present invention are described herein with respect to techniques employed in a cellular telephone operating in a wireless communication network. However, the invention is not so limited, and the inventive concepts disclosed and claimed herein may be advantageously applied in other contexts as well, including, for example, a wireless base station, or even in wired communication systems. Those skilled in the art will appreciate that the detailed design of cellular telephones, wireless base stations, and other communication devices may vary according to the relevant standards and/or according to cost-performance tradeoffs specific to a given manufacturer, but that the basics of these detailed designs are well known. Accordingly, those details that are unnecessary to a full understanding of the present invention are omitted from the present discussion.

Furthermore, those skilled in the art will appreciate that the use of the term “exemplary” is used herein to mean “illustrative,” or “serving as an example,” and is not intended to imply that a particular embodiment is preferred over another or that a particular feature is essential to the present invention. Likewise, the terms “first” and “second,” and similar terms, are used simply to distinguish one particular instance of an item or feature from another, and do not indicate a particular order or arrangement, unless the context dearly indicates otherwise.

As was noted above with respect to FIG. 1, the modem circuits and audio circuits of a cellular telephone (or other communications transceiver) introduce delays in the audio path between the microphone at one end of a communication link and the speaker at the other end. Of the total round-trip delay in a bi-directional link, the delay introduced by a cellular phone includes the time from when a given communication frame is received from the network until the audio contained in that frame is reproduced on the loudspeaker, as well as the time from when audio from the microphone is sampled until that sampled audio data is encoded and transmitted over the network. Additional delays may be introduced at other points along the overall link as well, so minimizing the delays introduced at a particular node can be quite important.

Figure 1:
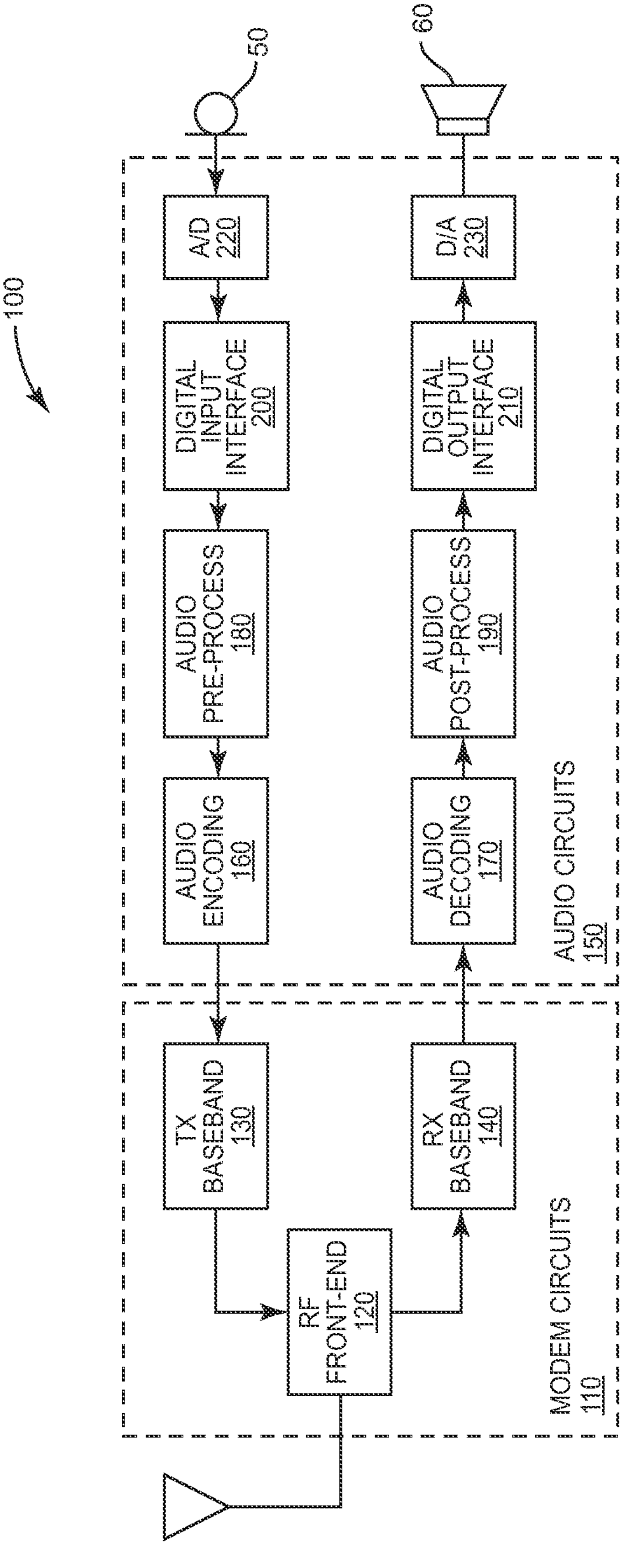
FIG. 1 is a block diagram of a cellular telephone.

Although FIG. 1 illustrates completely distinct modem circuits 110 and audio circuits 150, those skilled in the art will appreciate that the separation need not be a true physical separation. In some devices, for example, some or all of the audio encoding and decoding processes may be implemented on the same application-specific integrated circuit (ASIC) used for TX and RX baseband processing functions. In others, however, the baseband signal processing may reside in a modem chip (or chipset), while the audio processing resides in a separate application-specific chip. In some cases, regardless of whether the audio processing and baseband signal processing are on the same chip or chipset, the audio processing functions and radio functions may be driven by timing signals derived from a common reference clock. In others, these functions may be driven by separate clocks.

Figure 2A:
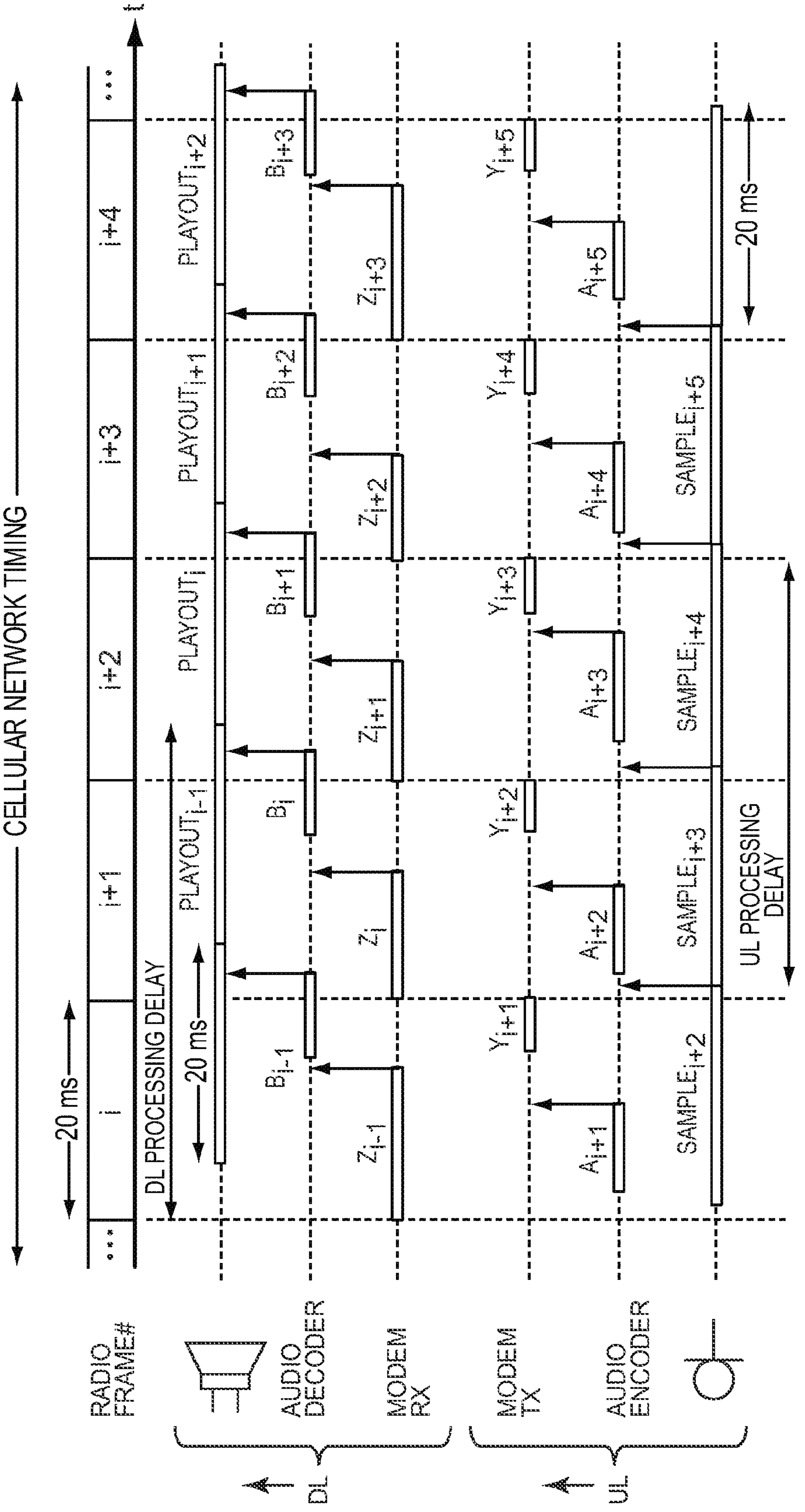
FIG. 2A illustrates audio processing timing related to network processing and frame timing in a communications network.

FIG. 2A illustrates how the processing times of the audio processing circuits and modem circuits relate to the network timing (i.e., the timing of a communications frame as “seen” by the antenna) during a speech call. In this example scenario, the radio frames and corresponding audio frames are 20 milliseconds long; in practice these durations may vary depending, for instance, on the network type. For simplicity, it is assumed that the radio frame timing is exactly the same in both directions of the radio communications link. Of course, this is not necessarily the case, but will be assumed here as it makes the illustration easier to understand. This assumption has no impact on the operation of the invention and it should not be considered as limiting the scope thereof.

In FIG. 2A, each radio frame is numbered with i, i−1, i+2, etc., and the corresponding audio sampling, playback, audio encoding, and audio decoding processes, as well as the corresponding radio processes, are referenced with corresponding indexes. Thus, for example, it can be seen at the bottom of the figure that for radio frame i+2, audio data to be transmitted over the air interface is first sampled from the microphone over a 20-millisecond interval denoted $Sample_{i+2}$. An arrow at the end of that interval indicates when the speech data (often in the form of Pulse-Code Modulated data) is available for audio encoding. In the next step (moving up, in FIG. 2A) it is processed by the audio encoder during a processing time interval denoted $A_{i+2}$. The arrow at the end of this interval indicates that the encoded audio frame can be sent to the transmitter processing portion of the modem circuit, which performs its processing during a time interval denoted $Y_{i+2}$. As can be seen from the figure, the modem processing time interval $Y_{i+2}$ does not need to immediately follow the audio encoding time interval $A_{i+2}$. This is because the modem processing interval is tied to the transmission time for radio frame i+2; this will be discussed in further detail below.

The rest of FIG. 2A illustrates the timing for processing received audio frames, in a similar manner. The modem processing time interval for a received radio frame k is denoted $Z_k$ while the audio processing time is denoted $B_k$. The interval during which the received audio data is reproduced on the speaker is denoted $Playout_k$.

The $Playout_k$ and $Sample_k$ intervals must generally start at a fixed rate to sample and playback continuous audio streams for the speech call. In the exemplary system described by FIG. 2A, these intervals recur every 20 milliseconds. However, the various processing times discussed above ($A_k$, $B_k$, $Y_k$, and $Z_k$) may vary during a speech call, depending on such factors as the content of the speech signal, $Sample_k$, the quality of the received radio signal, the channel coding and speech coding used, the number and types of other processing tasks being concurrently performed by the processing circuitry, and so on. Thus, there will generally be jitter in the timing of the delivery of the audio frames between the audio processing and modem entities.

Because of the sequential nature of the processing, several relationships apply among the various processing times. First, for the outbound processing, the modem transmit processing interval $Y_k$ end no later than the beginning of the corresponding radio frame. Thus, the latest start of the modem transmit processing interval $Y_k$ is driven by the radio frame timing and the maximum possible time duration of $Y_k$. This means that the corresponding audio processing interval $A_k$ should start early enough to ensure that is completed, under worst case conditions, prior t this latest start time for the modem transmit processing interval. Accordingly, the optimal start of the audio sampling interval $Sample_k$, relative to the frame time, is determined by the maximum time duration of $Y_k+A_k$ in order to ensure that an encoded audio frame is available to be sent over the cellular network.

For inbound processing, the start of the modem receive processing interval ($Z_k$) is dictated by the cellular network timing (i.e., by the radio frame timing at the receive antenna) and is outside the control of the cellular telephone. Second, the start of the audio playback interval $Playout_k$, relative to the radio frame timing, should advantageously be no earlier than the maximum possible duration of the modem receive processing interval $Z_k$ plus the maximum possible duration of the audio processing interval $B_k$, in order to ensure that decoded audio data is always available to be sent to the speaker.

Looking more closely at the inbound (downlink) processing chain in FIG. 2A, it will be appreciated that the start of each modem receive processing interval $Z_k$ may differ from an exact 20-millisecond timing due to various factors, e.g., network jitter and modem processing times. For example, some variation might arise from variations in the transmission time used by the underlying radio access technology. One example is in GSM systems, where the transmission of two consecutive speech frames is not always performed with a time difference of exactly 20 milliseconds, because of the details of the frame/multi-frame structure of GSM’s TDMA signal. In these systems, a speech frame is not available for modem processing exactly every 20 milliseconds. Instead the audio frames arrive at intervals of 18.5, 18.5, and 23 milliseconds; this pattern repeats every 60 milliseconds. In Wideband Code-Division Multiple Access (WCDMA) systems, the modem circuits may also output audio frames at uneven intervals due to the presence of other parallel activities performed by the modem, such as the processing of packet data send or received over a High-Speed Packet Access (HSPA) link. Systems where circuit-switched voice is transmitted over a high-speed packet link will also exhibit significant jitter. In conventional audio processing circuits, these variations are typically handled by assuming worst-case jitter and adapting audio processing and audio rendering to accommodate the worst-case delays.

Figure 2B:
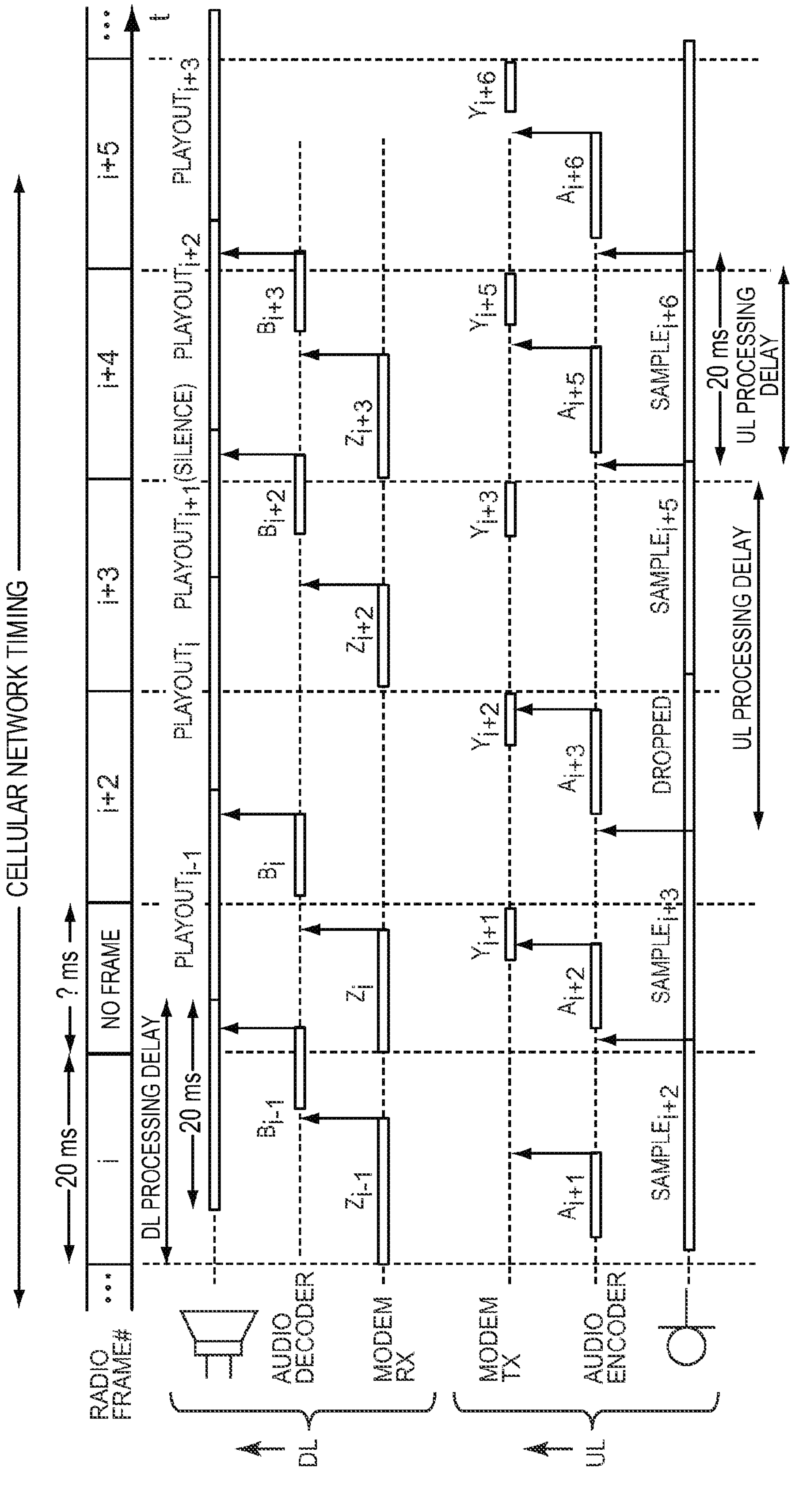
FIG. 2B illustrates audio processing timing related to network processing and frame timing during handover in a communications network.

Another source of timing variations is handovers of a telephone call from one base station to another. During the handover, the timing of the uplink and downlink communication frames might change. Further, one or more speech frames might be lost. Accordingly, the audio processing may need to be synchronized with the network timing after a handover. This is illustrated in FIG. 2B, where a handover occurs after the transmission of network communication frame i. During the period marked as "No frames," no data will be sent or received over air.

Depending on how long this period is, the modem might receive a new audio frame from the audio circuit before the previous one has been transmitted. Since the modem will only send the last one received, the old frame will be discarded. In the illustrated example, frame $A_{i+1}$ is close to being discarded, as frame $A_{i+2}$ arrives just after the modem processing of $Y_{i+1}$ begins. Thus, frames $A_{i+1}$ to $A_{i+3}$ are processed very late by the modem circuit). Frame $Y_{i+1}$ is sent in radio frame i+2, frame $Y_{i+2}$ is sent in radio frame i+3, and so on, until frame $Y_{i+3}$ is sent in i+4.

To get the network timing and audio processing back in sync, some audio samples received over the microphone can be dropped, after which audio is once again in sync. This is shown in the bottom line of FIG. 2B. With this approach, however, some speech will be lost at each resynchronization.

In the other direction, the handover period is manifested by an interval of silence from the loudspeaker. Because audio frame $B_{i+2}$ is delayed by the handover interval, there is no valid speech data to play out of the loudspeaker immediately after $\text{Playout}_i$. When audio processing once again delivers a frame the play out can start immediately.

The processing illustrated in FIGS. 2A and 2B and summarized above is based on an assumption that the cellular modem and the audio application use the same clock, or at least that there is no drift between the clocks used for these circuits. If this is not the case, and the time when PCM audio is received and sent "slides" with respect to the modem's frame timing, then the audio processing on both uplink and downlink needs to be resynchronized each time the drift is too large. Depending on whether the audio processing clock is faster or slower than the cellular modem clock, either PCM audio samples need to be dropped or added when a resynchronization occurs. In this scenario, the modem will have to send sync information more often than only during network resynchronization. If the drift between the two clocks is known and is relatively fixed, then sample rate conversion can be done directly when PCM audio is received and sent to external microphone and loudspeaker.

To minimize dropped audio samples and silent speech intervals, a synchronization process that can accommodate both clock drift as well as abrupt changes in the relationship between audio processing frame timing and network communication frame timing is needed. In various embodiments of the present invention, this problem is addressed with the use of time scaling. Time scaling is performed by an audio data signal processing algorithm that changes the duration of a digital audio signal. The time-scaling algorithm can either stretch or compress a segment of digital audio without significantly reducing the audio quality. An advantage of time scaling over sample-rate conversion is that the former does not change the pitch of the speech, thus better preserving the intelligibility of the speech.

Several time-scaling algorithms suitable for speech signals and music signals are well known. An example of the former, using a technique called overlap-add based on waveform similarity (WSOLA), is described in W. Verhelst and M. Roelands, "An overlap-add technique based on waveform similarity (WSOLA) for high quality time-scale modification of speech," in *IEEE ICASSP,* 1993, vol. 2, pp. 554-557. A related technique suitable for time-scaling music signals is described in S. Grofit and Y. Lavner, "Time-scale modification of audio signals using enhanced WSOLA with management of transients," in *IEEE Transactions on Audio, Speech, and Language*, vol. 16, no. 1, pp. 106-115, January 2008. Of course, the present invention is not limited to these or any other particular time-scaling algorithms. Further, because the details of the time-scaling algorithm are not necessary to a full understanding of the present invention, those details are not presented herein.

Time scaling may be used on both outbound (e.g., uplink) and inbound (e.g., downlink) audio processing, in combination with a process that adapts the timing of the audio processing to that of the modem. In effect, a collection of audio sa pies of arbitrary length can be fitted to a series of network communication frames that have a fixed size, while preserving speech quality and while recovering or maintaining correct synchronization. For outbound data, this technique can be used to synchronize audio processing with modem timing without losing any speech data, even in the event of an interruption in network connectivity due to handover. For inbound data, the technique can be used to ensure a consistent delivery of speech data to the D/A converter and loudspeaker in the face of jitter, handover-related delays, and the like, without incurring the delays caused by excessively long buffers. In either case, the audio processing can be self-adapting, without being based on static timing and predetermined worst-case analysis. In either case, the techniques will accommodate clock drift between audio and modem circuits, as well as jitter and handover-related delays.

Figure 3:
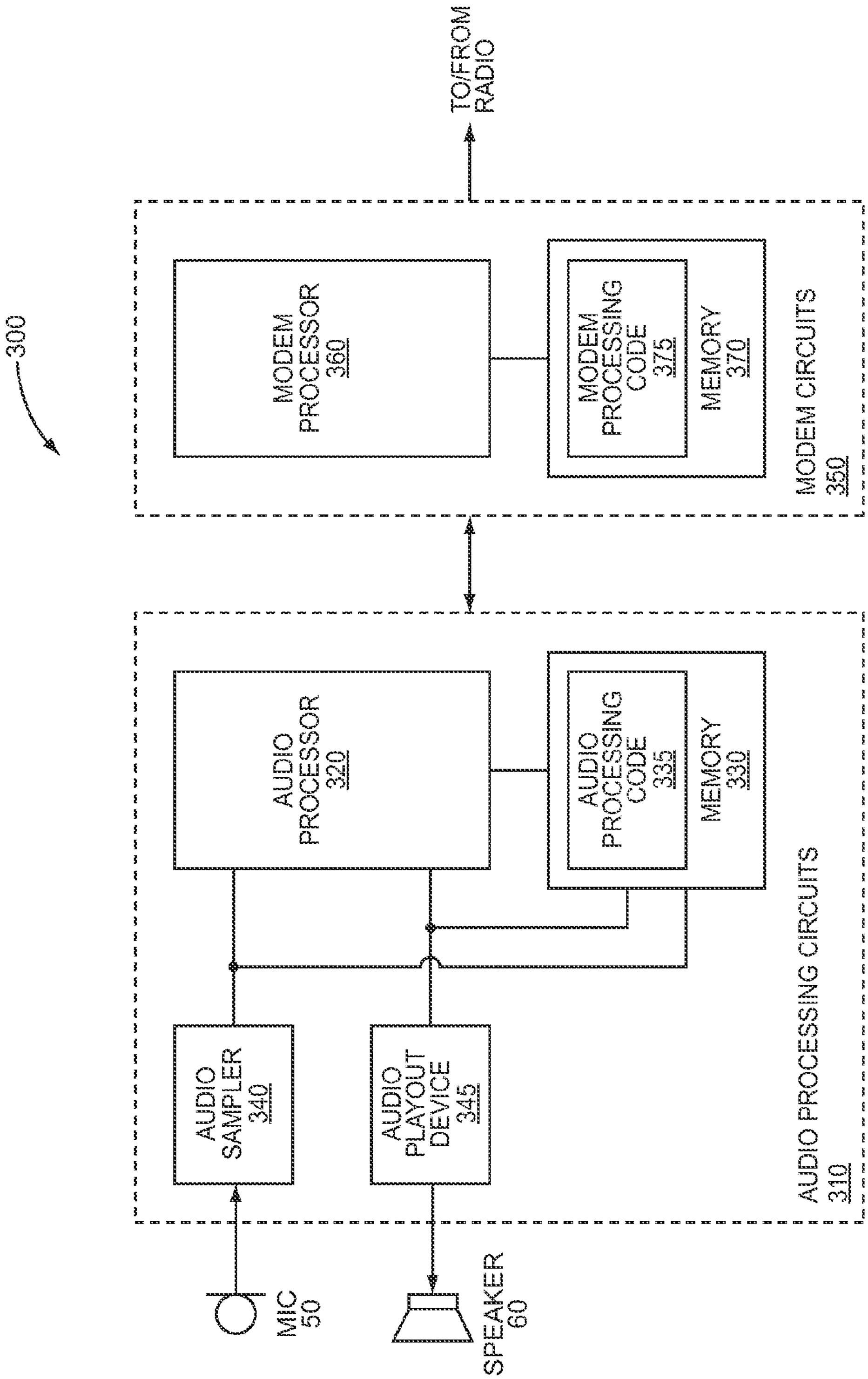
FIG. 3 is a block diagram of elements of an exemplary communication device according to some embodiments of the invention.

To provide context for the detailed discussion of these techniques that follows, a block diagram illustrating functional elements of an example device configured to use time scaling techniques to control audio processing is provided in FIG. 3. This figure shows an example communication device 300 configured to carry out one or more of the inventive techniques disclosed herein, including an audio processing circuit 310 communicating with a modem circuit 350, via a bi-directional message bus. The audio processing circuit 310 includes an audio sampling device 340, coupled to microphone 50, and audio playout device 345 (e.g., a digital-to-analog converter) coupled to speaker 60, as ell as an audio processor 320 and memory 330. Memory 330 stores audio processing code 335, which comprises program instructions for use by audio processor 320. Similarly, modem circuit 350 includes modem processor 360 and memory 370, with memory 370 storing modem processing code 375 for use by the modem processor 360. Either of audio processor 320 and modem processor 360 may comprise one or several microprocessors, microcontrollers, digital signal processors, or the like, configured to execute program code stored in the corresponding memory 330 or memory 370. Memory 330 and memory 370 in turn may each comprise one or several types of memory, including read-only memory, random-access memory, flash memory, magnetic or optical storage devices, or the like. In some embodiments, one or more physical memory units may be shared by audio processor 320 and modem processor 360, using memory sharing techniques that are well known to those of ordinary skill in the art. Similarly, one or more physical processing elements may be shared by both audio processing and modem processing functions, again using well-known techniques for running multiple processes on a single processor. Other embodiments may have physically separate processors and memories for each of the audio and modem processing functions, and thus may have a physical configuration that more closely matches the functional configuration suggested by FIG. 3.

Certain aspects of the techniques described herein for coordinating audio data processing and network communication processing are implemented using control circuitry, such as one or more microprocessors or microcontrollers configured with appropriate firmware or software. This control circuitry is not pictured separately in the exemplary block diagram of FIG. 3 because, as will be readily understood by those familiar with such devices, the control circuitry may be implemented using audio processor 320 and memory 330, in some embodiments, or using modem processor 360 and memory 370, in other embodiments, or some combination of both in still other embodiments. In yet other embodiments, all or part of the control circuitry used to carry out the various techniques described herein may be distinct from both audio processing circuits 310 and modem circuits 350. Those knowledgeable in the design of audio and communications systems will appreciate the engineering tradeoffs involved in determining a particular configuration for the control circuitry in any particular embodiment, given the available resources.

As noted, the time-scaling algorithm can be added to either uplink or downlink processing, or both, and is logically performed along with other audio pre-processing and/or post-processing functions, e.g., in the audio pre-processing circuit 180 and/or audio post-processing circuit 190 of FIG. 1.

On the uplink the audio processing in audio processing circuits 310 can be started without any synchronization with the modem circuits 350. A deviation between when the package is sent to the modem and when it is actually needed for further processing by the modem is detected, and then used to synchronize the uplink. For example, if the initial timing is such that the audio frame is delivered 12 milliseconds early, then the audio processing timing should be adjusted so that processing of audio data frames starts 12 milliseconds later, in order to minimize latency in the system. A time-scaling algorithm is used to decrease this gap slowly.

The time-scaling algorithm is used to compress the audio data gradually, so that the changes to audio quality are imperceptible. For instance, the algorithm may be configured in some embodiments to compress 21 milliseconds of audio data from the microphone to 20 milliseconds (corresponding to the audio payload of a communications frame). After twelve frames, or 240 milliseconds, the 12-millisecond gap is removed and subsequent speech frames are delivered at an optimal timing relative to the communication frame timing.

A time-scaling algorithm is used in a similar way on the downlink. Audio processing is begun as soon as the audio frame is received from modem. If digital output is done on a block size of X milliseconds, then a new block will be transfer to the audio output hardware (e.g., D/A 230 and speaker 60) every X milliseconds. If the audio and modem circuits are not in sync, then audio processing could be completed δ milliseconds ($X>\delta\geq 0$) before a block will be transferred. Data will then have to wait X-δ milliseconds before it is sent to the loudspeaker. With time scaling, this delay can be removed. For instance, assume that X is 20 milliseconds and that the audio data is output to digital output interface circuit 210 in 20-millisecond PCM blocks. Assume further than an initial delay from the completion of audio processing to the output of that block is 12 milliseconds. If the time scaling process is configured to compress each 20 milliseconds of audio data to 19 milliseconds, then during each of the next 12 frames the time scaling will eliminate 1 millisecond of the delay. The compressed digital audio can be fed to the D/A 230 and loudspeaker 60 at normal clock rates, so that the audio circuit and modem circuit are completely in sync after the 12 frames are complete.

In some embodiments, the difference between when the audio processing is finished and the subsequent processing begins is directly measured, and used to control the time scaling. On the uplink this difference is the interval between when audio processing is finished and when modem processing starts. On the downlink this difference is the interval between when audio processing is finished and when the corresponding audio is actually delivered to the loudspeaker. In other embodiments, the completion time for audio processing of a given block is compared to a pre-determined timing "window," which reflects an optimal timing relationship between the audio processing and modem processing. If the audio processing falls outside that timing window, then one or more subsequent audio data frames are time-scaled to adjust their completion times.

Figure 4:
FIG. 4 illustrates pre-determined timing windows for completion of audio processing, relative to the start of subsequent processing.

FIG. 4 illustrates how this may be done, $t_{n-1}$ and $t_n$ represent the times when the audio frame is required by the modem or by loudspeaker—these times can be viewed as the absolute latest times for completion of the audio processing. Of course, a short interval between the completion of audio processing and the beginning of subsequent processing may be preferred, in many instances, to accommodate the delivery time between the audio processing and modem processing circuits. Thus, $t^{low}$ and $t^{high}$ represent a valid interval, i.e., an optimal timing window, relative to $t_{n-1}$ and $t_n$, for audio processing to be finished. For instance, if audio processing is completed between $t_n$ and $t_n-t^{low}$ then it is too late. If audio processing is completed between times $t_{n-1}$ and $t_{n-t}^{high}$ then it is too early.

Time scaling is used to adjust the timing if the processed audio block arrives outside the windows defined by $t^{low}$ and $t^{high}$. When a package arrives earlier than $t_n-t^{high}$, the time-scaling algorithm will compress audio for one or more subsequent audio packets, thus moving the completion of subsequent blocks later, relative to the communication frame timing. On the other hand, if the package arrives between $t_n-t^{low}$ and $t_n$, time scaling is used to expand the audio. More details are provided below.

The values for $t^{low}$ and $t^{high}$ are set such that the short-term jitter in the audio processing is less than $(t^{low}-t^{high})/2$. (The reason for dividing with 2 is that for a single frame it is unknown whether the timing represents worst case or best case). Also, $t^{low}$ is set such that it is allowing some jitter in the transport time from one process to the next.

Figure 5:
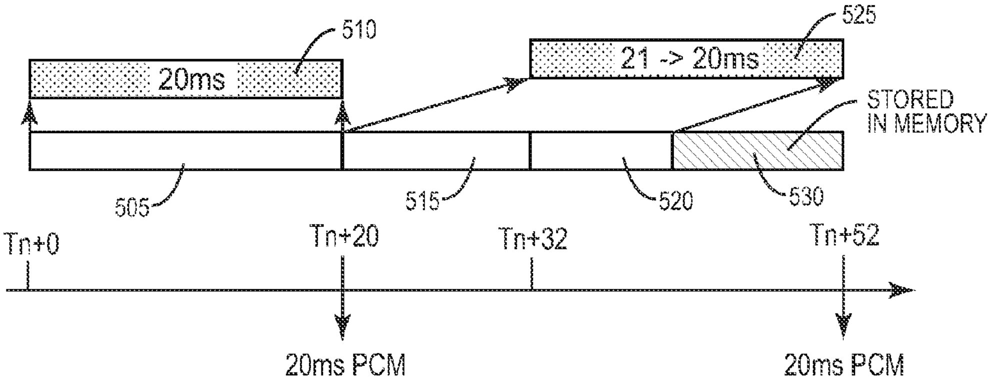
FIG. 5 illustrates time scaling of audio data frames to compress audio data.
Figure 6:
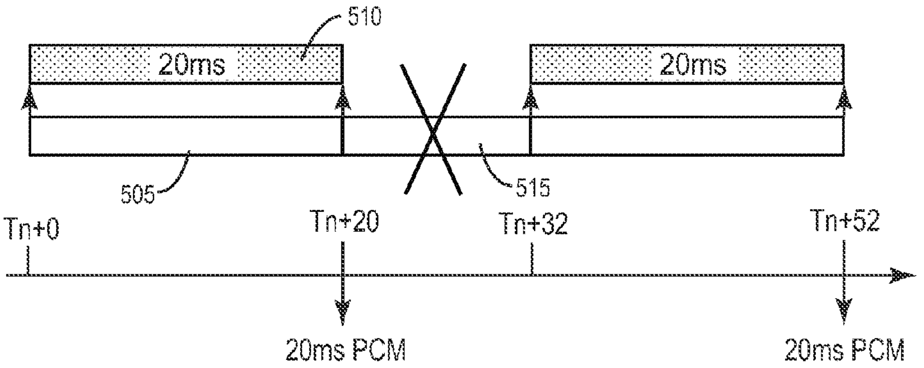
FIG. 6 illustrates the dropping of audio data to achieve synchronization without the use of time scaling.
Figure 7:
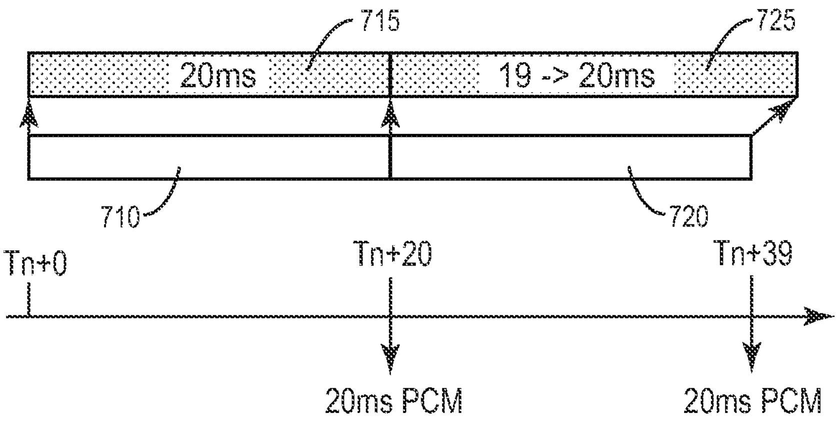
FIG. 7 illustrates time scaling of audio data frames to expand audio data.

The use of time scaling to adjust the completion times of audio processing can be described in more detail with respect to FIGS. 5-7. While described here with respect to processing of audio data for outbound transmission (e.g., in an uplink of a wireless communications network), the principles are more generally applicable.

As noted above, audio processing in a communications device can start without any synchronization between the audio processing circuits and the modem circuits. Thus, one or more initial blocks of processed audio may be sent to the modem at an arbitrary time, and buffered by the modem circuit until needed. Referring to FIG. 4, if this initial processed audio is sent to the modem circuit at a time that falls within the timing window defined by $t^{high}$ and $t^{low}$, then no correction is required. Otherwise, an adjustment is needed. If an adjustment is needed, the extent of the required adjustment can be calculated as Adjustment=diff−($t^{high}$−$t^{low}$)/2, where diff is the start time for the modem processing minus the completion time for the audio processing. In other words, diff represents the interval between the delivery time of a processed audio block and the time at which it is first taken into use by the modem processing.

First, adjustments greater than zero, i.e., situations where the audio processing is completed early, are considered. It will be appreciated that DMA is normally used to transfer PCM audio data from digital hardware input to memory. Given that the normal block size is greater than 1, an odd block size can be inserted once such that the odd block, together with a block of standard size, is equal to the desired adjustment.

When the desired adjustment is larger than zero, then the corresponding number of samples are collected (NbrSample=AdjustmentTime*Samplerate) and stored in a memory buffer. The next frame of audio to be sent to the modem is then time-scaled to fit X milliseconds of audio samples (retrieved from the buffer and from the next audio block supplied by the audio processing) into a frame of size Y milliseconds. In some cases, the ratio of X/Y is set initially, i.e., is predetermined, and reflects a balance between preserving audio quality and providing fast synchronization. In some systems Y, the output frame size, could change dynamically depending on other parts of the system but the ratio X/Y could be fixed, so that X is changed according to any changes in Y. In still other systems, the ratio X/Y can be adapted, based on the frame size and/or the frame content. For instance, scaling can be intensified for frames consisting of only noise, while frames that contain speech are processed using smaller ratios.

The audio used in the time-scaling operation is taken from the memory buffer and from the following block of audio data provided by the audio processing circuit. The memory buffer is then updated with the samples left over from the block of audio data provided by the audio processing circuit. Because of the compression operation, the amount of buffered data will be smaller after the first compressed frame is generated. The compression process is then repeated for subsequent frames until the memory buffer is empty and synchronization is achieved.

For example, if the processed audio block size is 10 and the required adjustment is 12, we can collect one block of size 2, which can be combined with a standard block of size 10 to make a block of size 12, equal to the required adjustment. The time-scaling operation proceeds by taking the adjustment size (12, in this example), buffering it, and then compressing each of several received speech frames until the memory buffer is empty.

FIG. 5 illustrates another example with buffer size 20 and adjustment size 12 ms. Frame 510 includes a payload corresponding to 20 milliseconds of audio data, taken directly from audio data 505, is delivered from the audio processing circuit at time $T_n$+20. For the purposes of this example, it is assumed that it is determined at that time that the audio payload was delivered 12 milliseconds early. (In other words, the data was not needed until $T_n$+32.) Then, 12 milliseconds of audio data are buffered, as shown at 515. The buffered segment 515 is combined with the next 9 milliseconds of data from the subsequent audio processing block (shown as block 520). This combined 21 milliseconds of audio data is compressed to create a 20-millisecond frame 525, which can be delivered at any time up until $T_n$+52. The remaining portion of the audio block (11 milliseconds of audio data) is stored for a subsequent time-scaling operation.

If time scaling is used to consistently compress 21 milliseconds of audio data to 20-millisecond frames, then after 12 frames the entire delay will be removed and the audio processing circuit will be synchronized with the modem circuit. In effect, then, a 20-millisecond PCM clock (shown at the bottom of FIG. 5) is shifted by 12 milliseconds, to line up with the communication frame processing boundaries at $T_n$+52, $T_n$+72, etc.

If time scaling is not used to address the 12-millisecond offset in the above example, then either 12 milliseconds of audio must be dropped or the speech will always be delayed for at least 12 milliseconds. FIG. 6 illustrates the first case, where 12 milliseconds of buffered data 515 are simply discarded.

If the required adjustment is negative, i.e., if the audio processing is completed later than desired, then time scaling can be used to expand the audio data, rather than to compress. With respect to uplink processing, then, the required collection of audio samples from microphone is decreased to size Y where Y is chosen appropriately with respect to the time scaling ratio Y/X where X is the required frame size for the modem. The choice of Y depends on the selection between speech quality and fast synchronization. Time scaling is then used to expand Y milliseconds of audio to X milliseconds. This process is repeated until synchronization is achieved.

FIG. 7 shows the case where the required adjustment is −1 milliseconds, and where Y=19 milliseconds of PCM audio data is expanded to X=20 milliseconds and delivered at time $t_n$+39. A first block 710 of audio data is not time-scaled, and is delivered to the modem circuit as frame 715, at time $t_n$+20. Because this is later than the desired delivery time, the processing of the next audio frame includes time scaling. Thus, a 19-millisecond block of PCM audio data 720 is expanded to create a 20-millisecond audio frame 725. This can be delivered to the modem circuit one millisecond earlier, relative to the previous cycle, at $t_n$+39. In effect, then, a PCM frame clock, normally operating with a period of 20 milliseconds, is shifted one millisecond earlier.

Although some systems might use both compression and expansion opera ions, depending on whether audio processing is early or late relative to the subsequent processing, the expansion-based approach may be ineffective if an audio data frame is received too late to be used at all by the subsequent stages. Rather than using expansion to address late audio processing, it might be better in some systems to treat late-delivered audio as belonging to the next frame. This makes that late audio early, with respect to the next frame. Thus, cases where a negative adjustment is required (i.e., where audio processing needs to be completed earlier), can be treated by adding a frame time (e.g., 20 milliseconds to the required negative adjustment), to make the required adjustment positive. With this approach, the desired adjustment will always be larger than zero, and the time-scaling operations will always involve the compression of audio data.

On the downlink, audio data is normally rendered (e.g., converted to analog and delivered to the loudspeaker) as soon as possible after audio processing has finished. To handle jitter in processing, a small delay is often introduced, based on the size of jitter. This puts some limitation on the renderer, as it must respond directly at start of a voice call and at each time modem synchronization is changed and it needs to support the addition of some delay. To remove this limitation, time scaling can be added to the downlink processing. Optimally it is placed last in the audio processing chain, but before the point where the acoustic echo canceller receives its reference signal.

With time scaling, DMA can be setup for suitable buffer size (e.g., 1, 2, 4, 5, 10, or 20). If audio processing is finished within a target timing window (e.g., defined by $t^{high}$ . . . $t^{low}$ as discussed above), then no time scaling is needed and the time-scaling operation is bypassed. Otherwise an adjustment is calculated through Adjustment=diff−($t^{high}$−$t^{low}$)/2. The time-scaling algorithm will always on each input deliver output, but the size of the output will differ from the input size. Just as for the uplink processing, there are three cases:

Adjustment>0: Compress audio data

Adjustment<0: Expand audio data

Adjustment=0: No time scaling.

Figure 8:
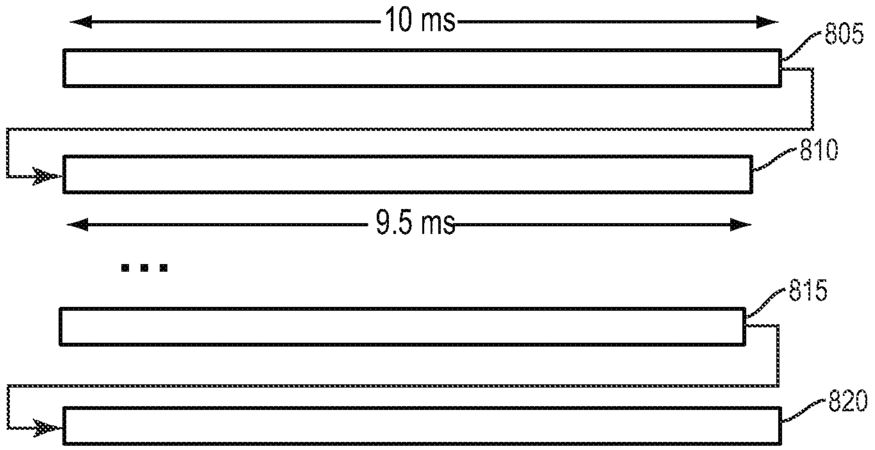
FIG. 8 illustrates effects of time scaling on DMA transfers of audio data.

For example, if the buffer size is 10, the required adjustment is 5, and the time scaling is configured to compress audio data by 5% (i.e., a compression ratio of 19/20), then the DMA transfer will have 10 buffers of size 9.5 milliseconds, after which buffer size will once again be 10 milliseconds. This is shown in FIG. 8, where buffers 805 and 820 are 10 milliseconds in length, while buffers 810 and 815 (and several intervening buffers) are each 9.5 milliseconds long.

There are alternative ways to output the audio data to achieve the adjustment. One is to DMA a first buffer having a size equal to the default size less the required adjustment, with subsequent DMA transfers being of the default size. For example, if the default buffer size is 10 and the adjustment is 5, and time scaling compresses the audio data by 5% (i.e., according to a compression ratio of 19/20), then of the 9.5 milliseconds of data produced by the time-scaling operation only the first 5 milliseconds is transferred in the first DMA transfer. The remaining 4.5 milliseconds is buffered and used to fill out the next 9 buffers to make them each of size 10 milliseconds.

It should be noted that the solutions described above do not directly address jitter between the cellular modem and audio interface. This has to be handled through an internal jitter buffer. If this jitter is large, an adaptive jitter buffer that limits the delay can be used. This jitter buffer might also use the time-scaling algorithm.

As suggested earlier, the techniques described above can be used to automatically handle the case where there is a clock drift between clock used by modem and the clock used for digital input and output hardware. If a solution that combines both compression and expansion capabilities is used, then a small margin can be added to the timing windows to detect clock drift. Thus, if drift results in a completion time that falls within a range $t^{low}$ . . . $t^{low}$−m of the subsequent processing start time, where it is the margin, then time scaling is used to expand the PCM data to correct for the drift. If the completion time for the audio processing drifts even later, e.g., to that the audio processing is completed less than $t^{low}$−m before the start of the subsequent processing, then the audio frame can be treated as belonging to the next frame, and the relative timing adjusted by compressing a series of frames.

Figure 9:
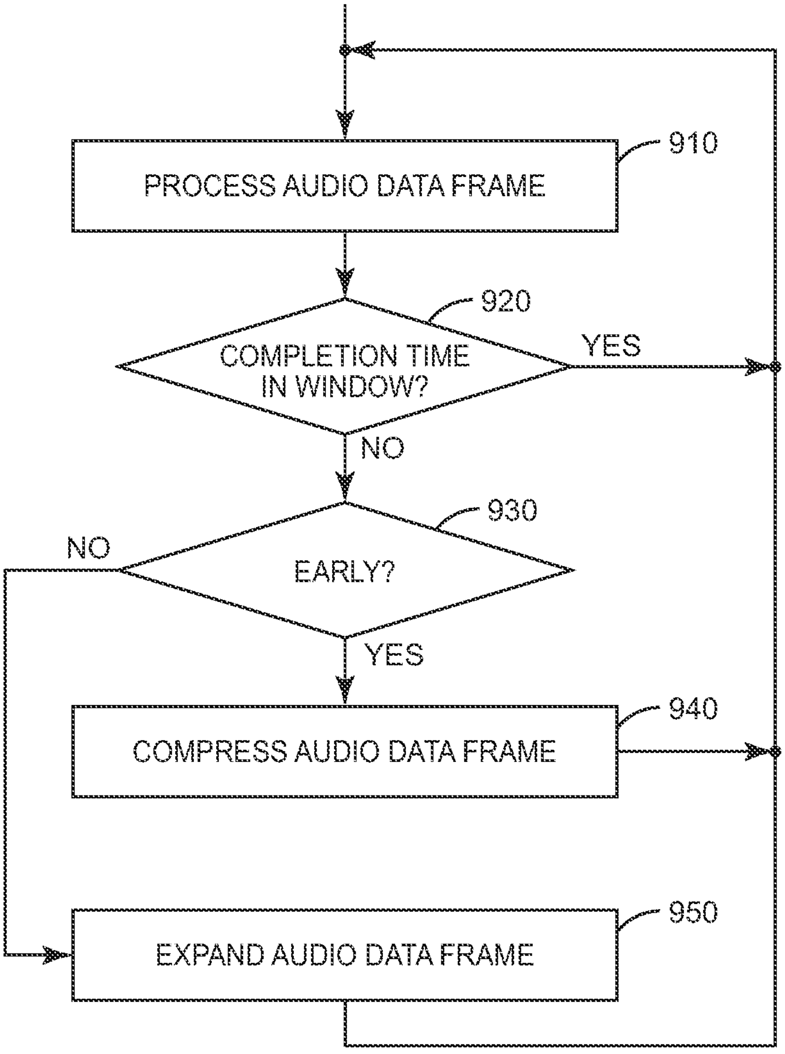
FIG. 9 is a process flow diagram illustrating an example technique for processing audio data in a communications device.

The preceding discussion described details of the application of time scaling to each of the outbound and inbound audio processing in a communications, such as the uplink and downlink audio processing in a mobile phone. FIG. 9 is a process flow diagram illustrating a generalized technique for applying time scaling, applicable to either direction of audio processing.

The illustrated process begins, as shown at block 910, with the processing of an audio data frame, in an audio processing circuit, for delivery to a subsequent step. For uplink processing in a mobile phone, the subsequent step is, for example, the modem processing preparatory to uplink transmission of the audio data. For downlink processing in a mobile phone, the subsequent step is the play out of the audio data for the user, including, e.g., conversion of the digital PCM audio into an analog signal for application to one or more loudspeakers.

As shown at block 920, an evaluation of whether the completion of the audio processing falls within a pre-determined timing window is then made. This evaluation may be made in a number of different ways. For instance, for uplink processing in a mobile phone, the completion time for processing the audio frame may be compared to start time for processing the corresponding communications frame by the communications processing circuit (modem). For example, the modem processing circuit in a mobile phone may be configured to provide a timing report to the audio processing circuit, in some embodiments, the timing report indicating whether the last audio frame was delivered to the modem early or late, and, in some embodiments, indicating the extent to which the delivery was early or late. (U.S. patent application Ser. No. 12/860,410, incorporated by reference above, describes several techniques for generating and processing such reports.)

In other embodiments, completion times for processing inbound audio data frames (e.g., received audio data in a mobile phone) are evaluated relative to start times for audio playout of the audio frames. In some embodiments, for example, a modem processing circuit may be configured to report processing times for received communication frames to the audio processing circuits, along with the payload for those frames. With this information, the audio circuits can estimate the communications frame timing relative to the audio frame processing timing, to determine whether or not the audio processing cycles end within a desired timing window. (U.S. patent application Ser. No. 12/858,670, also incorporated by reference above, provides further details of this approach.)

If the audio processing completion time falls within the desired timing window, then no adjustments to the timing are needed, and the next audio data frame is processed (at block 910) without any adjustment. On the other hand, once it is determined that the audio processing completion falls outside the desired timing window, one or more subsequent audio data frames are time-scaled to control the completion for processing those audio data frames. In the process illustrated in FIG. 9, the audio processing for one or more subsequent audio data frames follows one of two separate tracks. If the audio processing was completed early (as determined at block 930, in FIG. 9), then one or more audio data frames is formed from compressed audio data, as indicated at block 940, using a time-scaling algorithm. As discussed in detail above, this compression serves to move the audio processing frame timing later (e.g., closer to the communication frame timing, for uplink processing.) If the audio processing was completed late, on the other hand, then one or more subsequent audio data frames are expanded with a time-scaling algorithm, as indicated at block 950. This time-expansion of audio data serves to move the audio frame timing earlier, relative to the communications frame timing.

The process illustrated in FIG. 9 uses time scaling to perform either expansion or compression of audio data frames, depending on whether the audio processing is early or late. As noted above, it may be advantageous in some embodiments to use only compression to control audio processing completion times. This is illustrated in the process flow diagram of FIG. 10, which illustrates the processing of an outbound audio data frame in a communications device (e.g., uplink processing in a mobile telephone).

Figure 10:
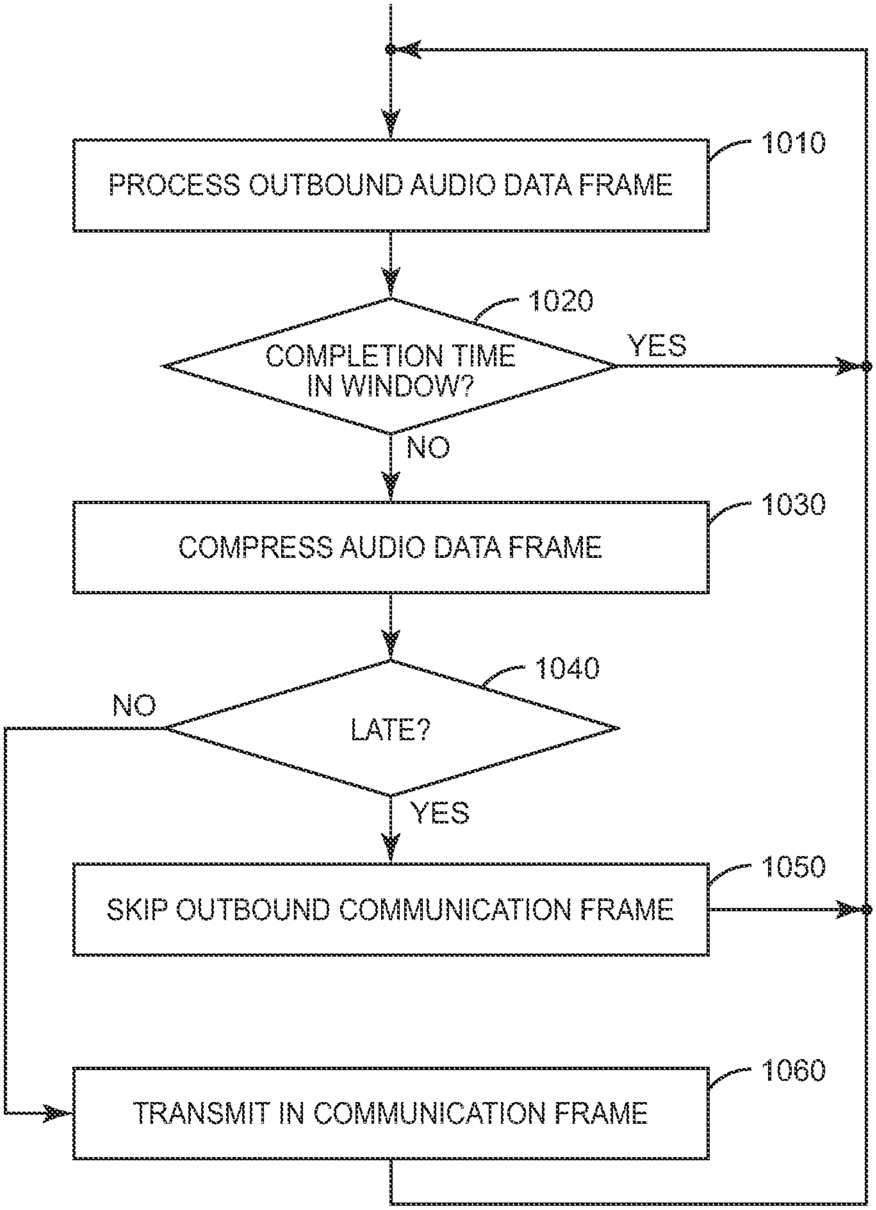
FIG. 10 is a process flow diagram illustrating another example technique for processing audio data in a communications device.

The process illustrated in FIG. 10 begins, as shown at block 1010, with the processing of an outbound audio data frame. Then, as shown at block 1020, it is determined whether the completion time for that audio processing falls within a predetermined window or not. If the audio processing completion time falls within the desired timing window, then no adjustments to the timing are needed, and the next audio data frame is processed (at block 1010) without any adjustment.

On the other hand, if the audio processing completion time falls outside the target timing window, whether it is early or late, a subsequent audio data frame is compressed, as shown at block 1030. This compression, as discussed above, will move the audio processing completion time for subsequent audio data frames later, or closer to the start time for the communication processing for transmission.

If the audio data frame that was delivered outside the timing window was early, then subsequent audio data frames can simply be transmitted in their corresponding communications frames, as indicated at block 1060 in FIG. 10. After one or several compression cycles, the audio processing and modem processing will be synchronized, with the completion time for the audio processing falling within the timing window.

If the audio data frame that was delivered outside the timing window was late, on the other hand, then an outbound communication frame is skipped, as indicated at block 1050, such that the audio data frame is assigned to the next communication frame. As a result, rather than being late, the audio data frame is treated as being early for the next communication frame. Again, after one or several compression cycles, the audio processing and modem processing will be synchronized, with the completion time for the audio processing falling within the timing window.

With the circuits and techniques described above, synchronization between the audio processing timing and the network frame timing can be achieved (and maintained) such that end-to-end delay is reduced and audio discontinuities are reduced. Those skilled in the art will appreciate that during call set-up the radio channels carrying the audio frames are normally established well before the call is connected. Thus, if the modem circuit 350 is configured so that no audio frames provided from the audio processing circuit 310 are actually transmitted until the call is connected, an optimal timing can be achieved from the start of the call.

As suggested above, these techniques will handle the case where the modem circuit and audio processing circuits use different clocks, so that there is a constant drift between the two systems. However, these techniques are useful for other reasons, even in embodiments where the modem and audio processing circuits share a common time reference. As discussed above, these techniques may be used to establish the initial timing for audio decoding and playback, at call set-up. These same techniques can be used to readjust these timings in response to handovers, whether inter-system or intra-system (e.g., WCDMA timing re-initialized hard handoff). Further, these techniques may be used to adjust the synchronization between the audio processing and the modem processing in response to variability in processing loads and processing jitter caused by different types and numbers of processes sharing modem circuitry and/or audio processing circuitry.

Although the present inventive techniques are described in the context of a circuit-switched voice call, those skilled in the art will appreciate that these techniques may also be adapted for other real-time multimedia use cases such as video telephony and packet-switched voice-over-IP. Indeed, given the above variations and examples in mind, those skilled in the art will appreciate that the preceding descriptions of various embodiments of methods and apparatus for coordinating audio data processing and network communication processing are given only for purposes of illustration and example. As suggested above, one or more of the specific processes discussed above may be carried out in a cellular phone or other communications transceiver comprising one or more appropriately configured processing circuits, which may in some embodiments be embodied in one or more application-specific integrated circuits (ASICs). In some embodiments, these processing circuits may comprise one or more microprocessors, microcontrollers, and/or digital signal processors programmed with appropriate software and/or firmware to carry out one or more of the processes described above, or variants thereof. In some embodiments, these processing circuits may comprise customized hardware to carry out one or more of the functions described above. Other embodiments of the invention may include computer-readable devices, such as a programmable flash memory, an optical or magnetic data storage device, or the like, encoded with computer program instructions which, when executed by an appropriate processing device, cause the processing device to carry out one or more of the techniques described herein for coordinating audio data processing and network communication processing. Those skilled in the art will recognize, of course, that the present invention may be carried out in other ways than those specifically set forth herein without departing from essential characteristic of the invention. The present embodiments are thus to be considered in all respects as illustrative and not restrictive, and all changes coming within the meaning and equivalency range of the appended claims are intended to be embraced therein.

What is claimed is:

1. A method of time scaling audio data in a communications device having an audio processing circuit configured to process audio data frames, a modem processing circuit configured to process corresponding communications frames, and an audio output, so as to synchronize the audio processing and modem processing circuits, the method comprising:

determining that a completion time for processing a first audio data frame by the audio processing circuit falls outside a pre-determined timing window having a beginning time ($t^{low}$) and an ending time ($t^{high}$) and prior to a time when the first audio data frame is required by one of the modem processing circuit and the audio output; and if the completion time is earlier than the beginning time ($t^{low}$) of the pre-determined timing window, synchronizing the audio processing circuit with the modem processing circuit by:

determining an adjustment time, wherein the adjustment time is:

$$(\text{difference}-(t^{high}-t^{low}/2)), \text{ and}$$

the difference is a start time of the modem processing circuit minus a completion time of the audio processing circuit;

determining a number of audio samples to collect from one or more subsequent audio data frames, wherein the number of audio samples corresponds to a product of the adjustment time and a sampling rate of the audio samples;

compressing the one or more subsequent audio data frames to collect the number of audio samples;

outputting the one or more compressed subsequent audio data frames; and wherein after compressing the one or more subsequent audio data frames, a completion time for processing a further subsequent audio data frame falls in the pre-determined timing window.

2. The method of claim 1, wherein the first audio data frame and the one or more subsequent audio data frames comprise outbound audio data frames to be transmitted by the communications device in respective communications frames, and wherein determining that the completion time for processing the first audio data frame by the audio processing circuit falls outside the pre-determined timing window comprises evaluating said completion time relative to a start time for processing the respective communications frame by the modem processing circuit.

3. The method of claim 2, wherein the completion time for processing the first audio data frame is earlier than the pre-determined timing window, and wherein compressing the one or more subsequent audio data frames comprises compressing the audio data frames according to a compression ratio.

4. The method of claim 1, wherein the first audio data frame and the one or more subsequent audio data frames comprise outbound audio data frames to be transmitted by the communications device in respective communications frames, and wherein determining that the completion time for processing the first audio data frame by the audio processing circuit falls outside the pre-determined timing window comprises evaluating said completion time relative to a start time for processing the respective communications frame by the modem processing circuit; and wherein the completion time for processing the first audio data frame is later than the ending time of the pre-determined timing window, and wherein expanding the one or more subsequent audio data frames comprises expanding the audio data frames according to an expansion ratio.

5. The method of claim 2, wherein the completion time for processing the first audio data frame is later than the ending time of the pre-determined timing window, and wherein the method comprises compressing a series of subsequent audio data frames, according to a compression ratio, so that the correspondence between audio data frames and communication frames is shifted by at least one communication frame.

6. The method of claim 1, wherein the first audio data frame and the one or more subsequent audio data frames comprise inbound audio data frames received by the communications device, and wherein determining that the completion time for processing the first audio data frame falls outside the pre-determined timing window comprises evaluating said completion time relative to a start time for audio playout of the first audio data frame to the audio output.

7. The method of claim 6, wherein the completion time for processing the first audio data frame is earlier than the pre-determined timing window, and wherein compressing the one or more subsequent audio data frames comprises compressing the audio data frames according to a compression ratio.

8. The method of claim 6, wherein the completion time for processing the first audio data frame is later than the ending time of the pre-determined timing window, and wherein expanding the one or more subsequent audio data frames comprises expanding the audio data frames according to an expansion ratio.

9. A communication device, comprising an audio processing circuit configured to time scale audio data frames, a modem processing circuit configured to process corresponding communications frames, and an audio output, wherein the audio processing circuit is configured to:

determine that a completion time for processing a first audio data frame falls outside a pre-determined timing window having a beginning time ($t^{low}$) and an ending time ($t^{high}$) and prior to a time when the first audio data frame is required by one of the modem processing circuit and the audio output; and if the completion time is earlier than the beginning time ($t^{low}$) of the pre-determined timing window, synchronize the audio processing circuit with the modem processing circuit by further configuring the audio processing circuit to:

determine an adjustment time, wherein the adjustment time is:

$$(\text{difference}-(t^{high}-t^{low}/2)), \text{ and}$$

the difference is a start time of the modem processing circuit minus a completion time of the audio processing circuit;

determine a number of audio samples to collect from one or more subsequent audio data frames, wherein the number of audio samples corresponds to a product of the adjustment time and a sampling rate of the audio samples;

compress the one or more subsequent audio data frames to collect the number of audio samples;

output the one or more compressed audio data frames; and wherein after compressing the one or more subsequent audio data frames, a completion time for processing a further subsequent audio data frame falls in the pre-determined timing window.

10. The communication device of claim 9, wherein the modem processing circuit is configured to transmit the first audio data frame and the one or more subsequent audio data frames to a remote node, in respective communications frames, and wherein the audio processing circuit is configured to determine that the completion time for processing the first audio data frame falls outside the pre-determined timing window by evaluating said completion time relative to a start time for processing the respective communications frame by the modem processing circuit.

11. The communication device of claim 10, wherein the audio processing circuit is configured to compress the one or more subsequent audio data frames according to a compression ratio when the completion time for processing the first audio data frame is earlier than the pre-determined timing window.

12. The communication device of claim 9, wherein the modem processing circuit is configured to transmit the first audio data frame and the one or more subsequent audio data frames to a remote node, in respective communications frames, and wherein the audio processing circuit is configured to determine that the completion time for processing the first audio data frame falls outside the pre-determined timing window by evaluating said completion time relative to a start time for processing the respective communications frame by the modem processing circuit; and wherein the audio processing circuit is configured to expand the one or more subsequent audio data frames according to an expansion ratio when the completion time for processing the first audio data frame is later than the ending time of the pre-determined timing window.

13. The communication device of claim 10, wherein the audio processing circuit is configured to compress a series of subsequent audio data frames, according to a compression ratio, so that the correspondence between audio data frames and communication frames is shifted by at least one communication frame, when the completion time for processing the first audio data frame is later than the ending time of the pre-determined timing window.

14. The communication device of claim 9, wherein the modem processing circuit is configured to receive the first audio data frame and the one or more subsequent audio data frames in respective communications frames, from a remote source, and wherein the audio processing circuit is configured to determine that the completion time for processing the first audio data frame falls outside the pre-determined timing window by evaluating said completion time relative to a start time for audio playout of the first audio data frame to the audio output.

15. The communication device of claim 14, wherein the audio processing circuit is configured compress the one or more subsequent audio data frames according to a compression ratio when the completion time for processing the first audio data frame is earlier than the pre-determined timing window.

16. The communication device of claim 14, wherein the audio processing circuit is configured to expand the one or more subsequent audio data frame according to an expansion ratio when the completion time for processing the first audio data frame is later than the ending time of the pre-determined timing window.

17. A circuit operative in a communication device, the circuit comprising an audio processing circuit configured to:

determine that a completion time for processing of a first audio data frame falls outside a pre-determined timing window having a beginning time ($t^{low}$) and an ending time ($t^{high}$) and prior to a time when the first audio data frame is required by one of a modem processing circuit and an audio output;

synchronize the audio processing circuit with the modem processing circuit by further configuring the audio processing circuit to:

determine an adjustment time, wherein the adjustment time is:

$$(\text{difference}-(t^{high}-t^{low}/2)),\text{ and}$$

the difference is a start time of the modem processing circuit minus a completion time of the audio processing circuit;

determine a number of audio samples to collect from one or more subsequent audio data frames, wherein the number of audio samples corresponds to a product of the adjustment time and a sampling rate of the audio samples;

compress the one or more subsequent audio data frames to collect the number of audio samples;

output the one or more compressed audio data frames; and wherein after compressing the one or more subsequent audio data frames, a completion time for processing a further subsequent audio data frame falls in the pre-determined timing window.

18. The circuit of claim 17, wherein the modem processing circuit is configured to transmit the first audio data frame and the one or more subsequent audio data frames to a remote node, in respective communications frames, and wherein the audio processing circuit is configured to determine that the completion time for processing the first audio data frame falls outside the pre-determined timing window by evaluating said completion time relative to a start time for processing the respective communications frame by the modem processing circuit.

19. The circuit of claim 18, wherein the audio processing circuit is configured to compress the one or more subsequent audio data frames according to a compression ratio when the completion time for processing the first audio data frame is earlier than the pre-determined timing window.

20. The circuit of claim 17, wherein the modem processing circuit is configured to transmit the first audio data frame and the one or more subsequent audio data frames to a remote node, in respective communications frames, and wherein the audio processing circuit is configured to determine that the completion time for processing the first audio data frame falls outside the pre-determined timing window by evaluating said completion time relative to a start time for processing the respective communications frame by the modem processing circuit; and wherein the audio processing circuit is configured to expand the one or more subsequent audio data frames according to an expansion ratio when the completion time for processing the first audio data frame is later than the ending time of the pre-determined timing window.

21. The circuit of claim 18, wherein the audio processing circuit is configured to compress a series of subsequent audio data frames, according to a compression ratio, so that the correspondence between audio data frames and communication frames is shifted by at least one communication frame, when the completion time for processing the first audio data frame is later than the ending time of the pre-determined timing window.

22. The circuit of claim 17, wherein the audio processing circuit is configured to determine that the completion time for processing the first audio data frame falls outside the pre-determined timing window by evaluating said completion time relative to a start time for audio playout of the first audio data frame at the audio output.

23. The circuit of claim 22, wherein the audio processing circuit is configured to compress the one or more subsequent audio data frames according to a compression ratio when the completion time for processing the first audio data frame is earlier than the pre-determined timing window.

24. The circuit of claim 17, wherein the audio processing circuit is configured to determine that the completion time for processing the first audio data frame falls outside the pre-determined timing window by evaluating said completion time relative to a start time for audio playout of the first audio data frame at the audio output; and wherein the audio processing circuit is configured to expand the one or more subsequent audio data frames according to an expansion ratio when the completion time for processing the first audio data frame is later than the ending time of the pre-determined timing window.

25. The method of claim 1 further comprising:

if the completion time is later than the ending time of the pre-determined timing window, expanding one or more subsequent audio data frames by the audio processing circuit to advance the completion time for processing said subsequent audio data frames.

26. The communication device of claim 9, wherein the audio processing circuit is further configured to:

if the completion time is later than the ending time of the pre-determined timing window, expand one or more subsequent audio data frames by the audio processing circuit to advance the completion time for processing said subsequent audio data frames.

27. The circuit of claim 17, wherein the audio processing circuit is further configured to:

if the completion time is later than the ending time of the pre-determined timing window, expand one or more subsequent audio data frames by the audio processing circuit to advance the completion time for processing said subsequent audio data frames.

* * * * *